INDUCTIVE TUNING DEVICE

Filed May 12, 1958 2 Sheets-Sheet 1

INVENTOR.
EDWARD A. ABBOT
BY Darby & Darby
ATTORNEYS.

May 3, 1960 E. A. ABBOT 2,935,707

INDUCTIVE TUNING DEVICE

Filed May 12, 1958 2 Sheets-Sheet 2

INVENTOR.
EDWARD A. ABBOT

BY Darby & Darby
ATTORNEYS.

United States Patent Office 2,935,707 Patented May 3, 1960

2,935,707

INDUCTIVE TUNING DEVICE

Edward A. Abbot, New York, N.Y., assignor to Emerson Radio & Phonograph Corporation, Jersey City, N.J., a corporation of New York Application May 12, 1958, Serial No. 734,737

17 Claims. (Cl. 336—135)

This invention relates to inductive tuning devices and more particularly to inductive tuning devices for broadcast band radio receivers.

The tuning of broadcast band radio receivers is usually accompanied by varying either the capacitance or inductance of the RF section of the receiver. Regardless of which circuit parameter is chosen for variation, it is desirable that the variations in tuned frequency be linear with respect to the applied tuning motion, so that the tuning control posses the required sensitivity and permits accurate tuning over the entire range of broadcast frequencies. If the radio receiver is of the superheterodyne type, the tuning device usually tunes the local oscillator section of the receiver simultaneously with the RF section, so that a constant IF frequency is produced with a single tuning motion. This imposes the additional requirement of satisfactory "tracking" performance on the tuning device.

When the RF section of the receiver is tuned by varying the inductance, the tuning device includes a coil and associated magnetic core structure, which combine to form a variable inductance element. A common method of varying the inductance of the coil involves the use of a variable air gap in the associated magnetic core structure. As the air gap changes in size, the reluctance of the magnetic circuit in the core structure changes, with the result that the inductance of the coil is varied. This arrangement, however, suffers from the fact that the initial increase in size of the gap causes a very rapid change in the tuned frequency. For example, in a broadcast band RF gap tuner, the first 10 mils of gap separation may produce a 250 kc. shift in the tuned frequency, while a similar change in gap separation at the upper end of the frequency band may produce only a 25 kc. shift. Because of this non-linearity in the relation between tuned frequency and gap separation, it is usually necessary to resort to complex motion converting arrangement, such as gear systems, for changing the gap size. The difficulty in using gear systems for the first 10 mils of gap separation is believed apparent however, when it is realized that even a one mil error in the gear system, such as caused, for example, by backlash, will result in an error of 25 kc. in the tuned frequency. Therefore, the use of gear systems is made extremely expensive due to the small manufacturing tolerances required for satisfactory operation.

Accordingly, it is an object of this invention to provide an inductive tuning device which covers a wide range of tuned frequencies with a linear relationship between the variation in tuned frequency and the applied tuning motion.

It is a further object of this invention to provide an inductive tuning device which is relatively inexpensive to manufacture and which readily lends itself to miniaturization.

It is a still further object of this invention to provide an inductive tuning device for tuning the RF and local oscillator sections of a superheterodyne radio receiver, which tuning device provides close linear tracking of the RF and oscillator sections with respect to the applied tuning motion.

Briefly, the tuning device of the invention comprises a pair of magnetic core structures, each having a cup-shaped portion and a center portion. The center portion of each core structure lies within the cup-shaped portion along the major axis thereof and is so arranged that the centroid of its cross-sectional area is spaced a distance from the major axis. Mounting means are provided for mounting the pair of core structures with the major axes of the cup-shaped portions in alignment and the open ends thereof facing each other, so that the core structures are adapted for relative rotational movement about, and relative axial movement along, the major axes. By virtue of the above arrangement, the center portions of the core structures face each other and form a closed magnetic circuit with the cup-shaped portions. The reluctance of this circuit may be varied by axially separating the core structures to change the size of the air gap between the center portions and between the cup-shaped portions. Since the centroid of the cross-sectional area of the center portion of each core structure is spaced a distance from the major axis of the structure, the reluctance of the magnetic circuit may also be varied by rotating the core structures relative to each other about the major axes. A coil is mounted within the cup-shaped portions of the core structures surrounding the center portions, so that the inductance of the coil is varied when the reluctance of the magnetic circuit is varied. Finally, means are provided for simultaneously causing relative rotational and axial movements between the core structures in response to an applied tuning motion. This arrangement produces the initial shift in tuned frequency by a long mechanical travel of rotation between the core structures, rather than by the aforementioned critical 10 mils of axial gap separation, so that the variation in tuned frequency is linear with respect to the applied tuning motion.

In a preferred embodiment of the invention, the cross-sectional areas of the center portion of the core structures are D-shaped and a cam and cam-follower arrangement is utilized to produce the simultaneous rotational and axial movements between the core structure. If desired, a tapered coil may be employed to extend the range of tuned frequencies. By utilizing two pairs of magnetic core structures, the inductive tuning device of the invention may be used to tune and track the RF and local oscillator sections of a superheterodyne radio receiver.

Figure 1:
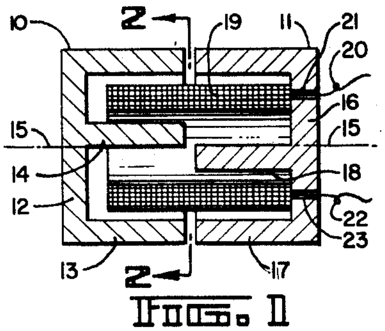
Fig. 1 is a vertical section of a pair of magnetic core structures having D-shaped center portions.
Figure 2:
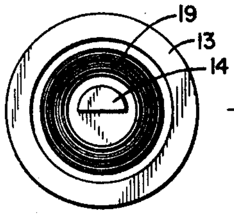
Fig. 2 is a vertical section of the core structure of Fig. 1 taken along the line 2—2 of Fig. 1.

Referring now to Fig. 1 of the drawing, there is shown a pair of magnetic core structures 10 and 11. Core structure 10 consists of a cup-shaped portion 13 and a center portion 14. The center portion lies along the major axis 15—15 of the cup-shaped portion and is integral with the closed end 12 thereof. As seen in Fig. 2, the center portion 14 has a D-shaped cross-sectional area, the centroid of which is spaced a distance from the major axis 15—15. Core structure 11 is similarly constructed and comprises a cup-shaped portion 17 and a center portion 18. The center portion 18 is also D-shaped and is integral with the closed end 16 of the cup-shaped portion 17, so that the two center portions 14 and 18 form a closed magnetic circuit with cup-shaped portions 13 and 17. A coil 19 is mounted inside of the cup-shaped portions and is arranged around the center portions. The coil is thereby provided with a high permeability closed flux path through the core structures 10 and 11. Leads 20 and 22 are respectively arranged to pass through openings 21 and 23 formed in the closed end 16 of core structure 11, so that coil 19 may be coupled to the RF section of the radio receiver being tuned. While core structures 10 and 11 may be fabricated of any suitable magnetic material, ferrites have been found especially useful due to their low core losses at the RF frequencies involved.

From the foregoing description of core structures 10 and 11, it is believed apparent that the reluctance of the magnetic circuit linking coil 19 may be varied either by rotating the structures relative to each other about axis 15—15 or by axially separating the structures along axis 15—15. When the core structures are rotated with respect to each other, the reluctance of the flux path through the center portions 14, 18 is varied, since the centroid of the cross-sectional area of each center portion is spaced a distance from the axis of rotation. When the core structures are axially separated, the variation in reluctance is caused by the increased air gap between the center portions 14, 18 and between the cup-shaped portions 13, 17.

Figure 3:
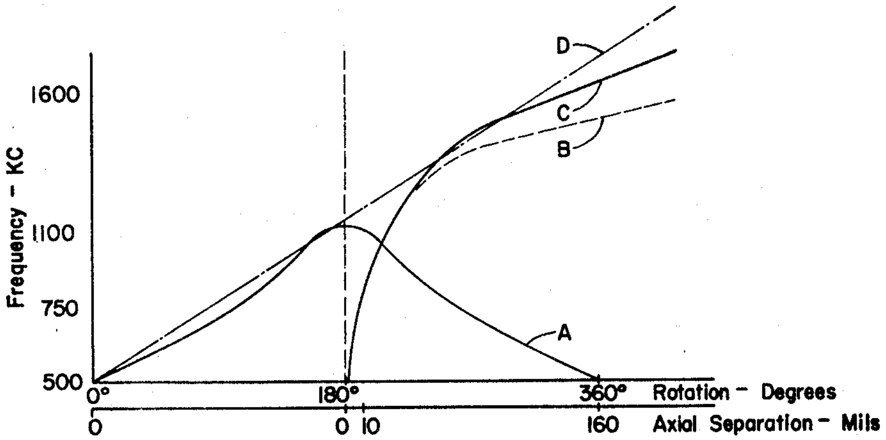
Fig. 3 is a series of curves showing the variations in tuned frequency caused by relatively rotating and axially separating the core structures of Figs. 1 and 2.

The tuning characteristics of the arrangement of Fig. 1 are shown by the series of curves in Fig. 3 of the drawing. Curve A represents the variations in tuned frequency obtained when the core structures 10 and 11 are rotated with respect to each other with no axial gap separation. As seen therein, the tuned frequency varies slowly at first and increases to a maximum at 180°, when the D-shape center portions are mirror-images of each other, as shown in Fig. 1. Further rotation produces a decrease in frequency, so that the curve for one complete revolution is bell-shaped. Curve B represents the variations in tuned frequency obtained when the core structures are axially separated with no relative rotation. It may be noted that the first 10 mils of gap separation produces about a 250 kc. shift in the tuned frequency, while further increases in gap separation produce much smaller frequency shifts. The tuned frequency reaches a "saturation" point above the knee of the curve, where further increases in gap separation produce little or no change in frequency. This of course determines the range of tuned frequencies which the tuning device can satisfactorily cover.

Figure 4:
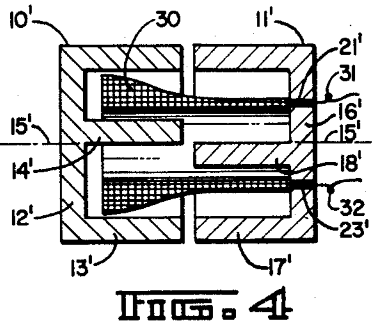
Fig. 4 is a vertical section of a pair of magnetic core structures with a tapered coil.

One way of extending the range of tuned frequencies which can be covered by a tuning device is shown in Fig. 4 of the drawing. As seen therein, a tapered coil 30 is substituted for the coil 19 in the core structure arrangement of Fig. 1. The coil 30 has leads 31 and 32 which are passed through the openings 21′ and 23′ formed in the closed end of core structure 11′. By tapering the coil, most of the turns of the coil are exposed to an air, high reluctance path when the core structures 10′ and 11′ are axially separated, rather than to a high permeability path through the core structures themselves. This results in a greater change in reluctance of the magnetic circuit and consequently, a greater change in tuned frequency. Curve C in Fig. 3 of the drawing shows the tuning characteristic for axial gap separation of the core structures with a tapered coil. The saturation point now occurs about 100 kc. higher, so that the range of tuned frequencies accommodated is extended by this amount.

The tuning characteristic obtained by simultaneously rotating and axially separating the core structure 10′ and 11′ of Fig. 4 is shown by curve D in Fig. 3 of the drawing. This curve is a composite of curves A and C and represents a linear variation in tuned frequency with respect to an applied rotational tuning motion. At the lower end of the range of tuned frequencies, the relative rotational motion between the core structures exerts the greatest control over the tuned frequency, since the axial gap separation is very small. This causes the tuned frequency to change comparatively slowly, so that the difficulties usually encountered during the critical initial 10 mils of axial gap separation are avoided. When the core structures are rotated 180° apart, the axial gap separation has increased to a point where further rotational motion does not affect the tuned frequency, so that all subsequent variations in tuned frequency are caused by axial gap separation even though relative rotation of the core structures continues. The resultant curve D is therefore linear over a wide range of tuned frequencies and a simple, inexpensive, mechanical drive system may be employed to provide the relative rotational and axial movements of the core structures for tuning. While curve D shows a tuning range from 500 kc. to 1600 kc., it is believed apparent that a tapered coil need not be used if a smaller tuning range is satisfactory. Similarly, if a larger tuning range is desired, the taper of the coil may be increased, thereby extending the upper limit of the range to approximately 1700 kc.

Figure 5:
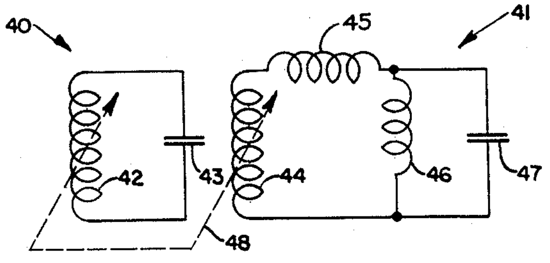
Fig. 5 is a circuit diagram of the RF and local oscillator sections of a superheterodyne radio receiver.
Figure 6:
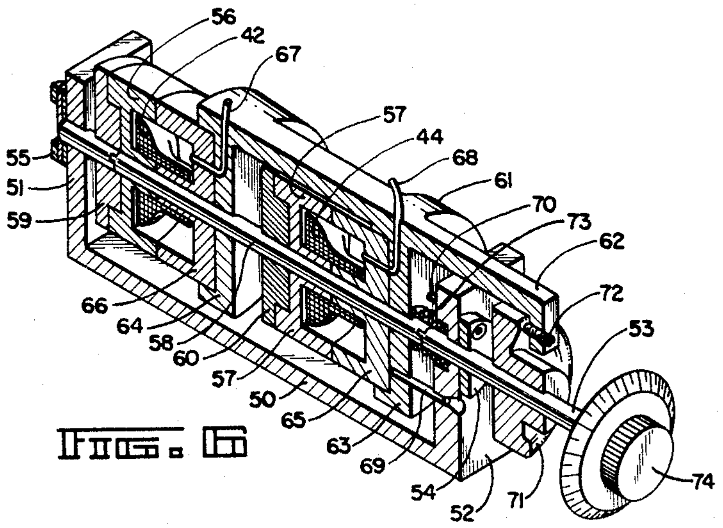
Fig. 6 is a perspective view, taken in vertical section, of an inductive tuning device suitable for tuning and tracking the RF and local oscillator sections of a superheterodyne radio receiver.

Figs. 5 and 6 of the drawing respectively show the RF and local oscillator sections of a superheterodyne radio receiver and an inductive tuning device suitable for tuning and tracking these sections, the tuning device constituting a preferred embodiment of the invention. As seen in Fig. 5, the RF section 40 of the receiver comprises a tuned circuit consisting of a variable inductance 42 and a capacitor 43. The local oscillator section 41 includes a variable inductance 44, a series "trimmer" inductance 45, a shunt "trimmer" inductance 46 and a capacitor 47. Inductances 42 and 44 are simultaneously varied by a means indicated schematically as 48, so that the RF and oscillator circuits are properly tracked. Since the range of tuned frequencies for the RF circuit is usually 3.3:1 while the range for the oscillator circuit is usually 2:1, the series and shunt trimmer inductances are used in the oscillator circuit to permit similar variable inductance units to be employed in the tuning device. The values of the trimmer inductances may be determined by the well known three point tracking method.

The inductive tuning device shown in Fig. 6 of the drawing comprises a fixed support member, or housing, 50 having upright end sections 51 and 52. A three-section shaft 53 is rotatably supported by bearings (not shown) in the housing end sections and is restrained from axial movement by collars 54 and 55. The two end sections of shaft 53 may be formed of metal, but the center section 58 preferably should be made of a non-magnetic material, such as nylon, for example, for reasons explained hereinafter. A D-shaped core structure 56, similar to the core structure shown in Fig. 1 of the drawing, is mounted on a mounting disk 59 which is arranged for rotation with shaft 53 by any convenient means (not shown). A second D-shaped core structure 57 is similarly mounted for rotation with shaft 53 upon a mounting disk 60, so that rotation of shaft 53 causes rotation of both core structures together. The tuning device also includes a movable support member, or housing, 61, which has a pair of spaced mounting disks 63 and 64 formed integrally therewith. Mounting disk 63 is arranged to support a third D-shaped core structure 65, while mounting disk 64 similarly supports a fourth D-shaped core structure 66. The coil 42, shown in the RF circuit in Fig. 5 of the drawing, is located within the cup-shaped portions of core structures 56 and 66, so that the combination of coil and core structure forms a single variable inductance element. Coil 44 is similarly arranged within the cup-shaped portions of core structures 57 and 65 to form a variable inductance element for the local oscillator section of the receiver. The leads 67 and 68 of the coils are brought out through the movable support member 61 for connection to the appropriate receiver circuit. Since the coils and associated core structures surround the shaft 53, it is important that the center section 58 of the shaft be made of a non-magnetic material to prevent magnetic "short-circuiting" of the air gaps between the center portions of the core structures.

The movable housing 61 is slidably supported by shaft 53 which passes through the mounting disks 63 and 64, so that core structures 65 and 66 may be moved axially with respect to core structures 56 and 57. Pins 69 and 70 are arranged between housing end section 52 and mounting disk 63 to prevent rotational movement of the movable housing 61 and associated core structures 65 and 66 when the shaft is rotated. A cam 71 and a cam-follower 72 are so arranged that rotation of shaft 53 produces axial movement of the housing 61. To this end, cam 71 is mounted on the shaft for rotation therewith and cam-follower 72 is mounted on a projection 62 of the movable housing. As seen in the drawing, the cam-follower may consist of a simple, threaded, screw member which is inserted in the projection 62, to thereby facilitate initial adjustment of the relative positions of the core structures. A coiled spring 73 is placed around shaft 53, between housing end section 52 and mounting disk 63, to keep the cam-follower in constant engagement with cam 71, so that rotation of the shaft in either direction causes axial movement of housing 61. To complete the assembly, a tuning knob 74 is mounted on the end of shaft 53. The tuning knob may be suitably calibrated in terms of the RF tuned frequencies.

Figure 7:
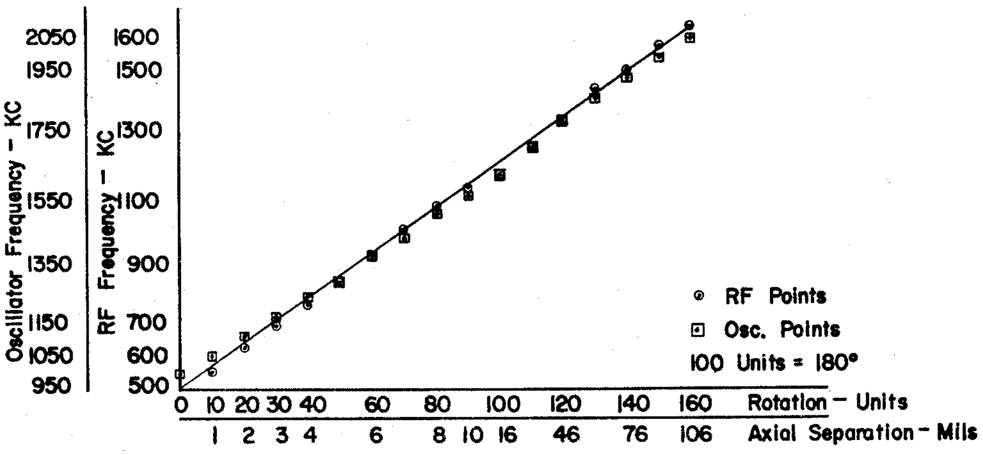
Fig. 7 is a curve showing the tuning characteristic of the device of Fig. 6.

In operation of the inductive tuning device of Fig. 6, movement of tuning knob 74 causes rotation of core structures 56 and 57. The same tuning motion also rotates cam 71 to cause axial movement of core structures 65 and 66. By this means, a single rotational tuning motion is made to simultaneously cause both axial and rotational movements between the core structures forming each inductive element. As hereinbefore explained, the resulting variations in tuned frequency are therefore linear with respect to the applied tuning motion. Since the inductive value of coils 42 and 44 is simultaneously varied by a single tuning motion, the inductive tuning device also provides good tracking of the RF and local oscillator sections of the receiver. The curve shown in Fig. 7 of the drawing is a representative tuning characteristic curve for the inductive tuning device of Fig. 6 with the following values of circuit components employed in the circuit of Fig. 5:

| | |
|---|---|
| Coils **42, 44** | 1.235 mh. to .116 mh. |
| Coil **45** | 17 $\mu$h. |
| Coil **46** | .975 mh. |
| Capacitor **43** | 83 $\mu\mu$f. |
| Capacitor **47** | 30 $\mu\mu$f. |

As an inspection of this curve indicates, the variations in tuned frequency for both the RF and local oscillator sections is linear with respect to the applied rotational tuning motion and excellent tracking is obtained. The relation between rotational and axial movements of the core structure may be seen from the "Rotation" and "Axial Separation" scales on the abscissa of the curve.

It is believed apparent that many changes could be made in the above-described inductive tuning device and many seemingly different embodiments of the invention constructed without departing from the scope thereof. Accordingly, it is intended that all matter contained in the above description or shown in the accompanying drawings shall be interpreted as illustrative and not in a limiting sense.

What is claimed is:

1. In an inductive tuning device, the combination comprising a pair of magnetic core structures, each of said core structures having a cup-shaped portion and a center portion, the center portion being located within said cup-shaped portion along the major axis thereof and having the centroid of its cross-sectional area spaced a distance from said major axis; means for mounting said magnetic core structures with the major axes of the cup-shaped portions in alignment and the open ends thereof facing each other, so that said core structures are adapted for relative rotational movement about, and relative axial movement along, said major axes, with the center portions thereof facing each other to form a closed magnetic circuit with said cup-shaped portions, the reluctance of said magnetic circuit thereby being subject to variation upon relative rotational or axial movement between said core structures; a coil mounted within the cup-shaped portions of said core structures surrounding the center portions thereof; and means for simultaneously causing relative rotational and axial movements between said core structures in response to an applied tuning motion, whereby the variation in tuned frequency caused by the variation in the inductance of said coil is linear with respect to the applied tuning motion.

2. Apparatus as claimed in claim 1, wherein said coil is tapered.

3. Apparatus as claimed in claim 1, wherein said means for mounting the magnetic core structure comprises a fixed support member, a rotatable shaft supported by said member and connected to one of said magnetic core structures for rotation thereof, and a movable support member supported by said shaft, said movable support member being connected to the other of said magnetic core structures for axial movement thereof.

4. Apparatus as claimed in claim 3, wherein said means for simultaneously causing relative rotational and axial movement between the magnetic core structures comprises a cam connected to said shaft for rotation therewith and a cam-follower connected to said movable support member.

5. Apparatus as claimed in claim 4, wherein said coil is tapered.

6. In an inductive tuning device, the combination comprising a pair of magnetic core structures, each of said core structures having a cup-shaped portion and a center portion, the center portion being located within said cup-shaped portion along the major axis thereof and having a D-shaped cross-sectional area, the centroid of said area being spaced a distance from said major axis; means for mounting said magnetic core structures with the major axes of the cup-shaped portions in alignment and the open ends thereof facing each other, so that said core structures are adapted for relative rotational movement about, and relative axial movement along, said major axes, with the center portions thereof facing each other to form a closed magnetic circuit with said cup-shaped portions, the reluctance of said magnetic circuit thereby being subject to variation upon relative rotational or axial movement between said core structures; a coil mounted within the cup-shaped portions of said core structures surrounding the center portions thereof; and means for simultaneously causing relative rotational and axial movements between said core structures in response to an applied tuning motion, whereby the variation in tuned frequency caused by the variation in the inductance of said coil is linear with respect to the applied tuning motion.

7. Apparatus as claimed in claim 6, wherein said coil is tapered.

8. Apparatus as claimed in claim 6 wherein said last-named means comprises means for rotating one of said magnetic core structures in response to the applied tuning motion and means for axially moving the other of said core structures in response to the rotational movement of said one core structure.

9. Apparatus as claimed in claim 8, wherein said means for axially moving the other of said core structures comprises a cam and a cam-follower.

10. Apparatus as claimed in claim 9, wherein said coil is tapered.

11. In an inductive tuning device for tuning and tracking the RF and local oscillator sections of a superheterodyne radio receiver, the combination comprising two pairs of magnetic core structures, each of said core structures having a cup-shaped portion and a center portion, the center portion being located within said cup-shaped portion along the major axis thereof and having the centroid of its cross-sectional area spaced a distance from said major axis; means for mounting each of said pairs of magnetic core structures with the major axes of the cup-shaped portions in alignment and the open ends of the cup-shaped portions facing each other, so that the core structures forming each pair are adapted for relative rotational movement about, and relative axial movement along, said major axes, with the center portions of each pair facing each other to form a closed magnetic circuit with the cup-shaped portions, the reluctance of the magnetic circuit for each pair of core structures thereby being subject to variations upon relative rotational or axial movement between the core structures of the pair; a pair of coils for said two pairs of magnetic core structures, each of said coils being mounted within the cup-shaped portions of the pair of core structures associated therewith surrounding the center portions thereof, one of said coils being adapted to form a variable inductance element in the RF section of the radio receiver and the other of said coils being adapted to form a variable inductance element in the local oscillator section of the receiver; and means for simultaneously causing relative rotational and axial movements between the core structures of each pair of core structures in response to an applied tuning motion, whereby the variation in tuned frequency of each section caused by the variation in the inductance of the coil associated therewith is linear with respect to the applied tuning motion.

12. Apparatus as claimed in claim 11, wherein the cross-sectional area of the center portion of each of said magnetic core structures is D-shaped.

13. Apparatus as claimed in claim 12, wherein each of said coils is tapered.

14. Apparatus as claimed in claim 12, wherein said last-named means comprises means for rotating one core structure of each pair of core structures in response to the applied tuning motion and means for axially moving the other core structure of each pair of core structures in response to the rotational movement of said one core structure of each pair.

15. Apparatus as claimed in claim 14, wherein said means for axially moving the other core structure of each pair of core structures comprises a cam and a cam-follower.

16. Apparatus as claimed in claim 15, wherein said means for mounting the magnetic core structure comprises a fixed support member, a rotatable shaft supported by said member, said shaft being connected to said cam and said one core structure of each pair of core structures for rotation thereof, a movable support member supported by said shaft for axial movement therealong, said movable member being connected to said cam-follower and said other core structure of each pair of core structures, so that rotation of said shaft causes axial movement of said other core structure of each pair, and means for preventing rotation of said movable support member upon rotation of said shaft.

17. Apparatus as claimed in claim 16, wherein each of said coils is tapered.

References Cited in the file of this patent

UNITED STATES PATENTS

| | | |
|---|---|---|
| 2,107,172 | Agricola | Feb. 1, 1938 |
| 2,496,058 | Mackey | Jan. 31, 1950 |
| 2,628,342 | Taylor | Feb. 10, 1953 |
| 2,702,860 | Farbanish | Feb. 22, 1955 |

FOREIGN PATENTS

| | | |
|---|---|---|
| 69,488 | Denmark | July 4, 1949 |
| 857,164 | France | Apr. 8, 1940 |

OTHER REFERENCES

Article: Miniature Ferrite Tuner Covers BC Band by Abbot and Lafer, Electronics, Feb. 28, 1958, pages 72 and 73.